United States Patent
Fritzsche et al.

(10) Patent No.: US 10,456,871 B2
(45) Date of Patent: Oct. 29, 2019

(54) SOLDER PASTE

(71) Applicant: Heraeus Deutschland GmbH & Co. KG, Hanau (DE)

(72) Inventors: Sebastian Fritzsche, Hanau (DE); Jürgen Schulze, Potsdam (DE); Jörg Trodler, Königs Wusterhausen (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 138 days.

(21) Appl. No.: 15/506,353

(22) PCT Filed: Aug. 21, 2015

(86) PCT No.: PCT/EP2015/069217
§ 371 (c)(1),
(2) Date: Feb. 24, 2017

(87) PCT Pub. No.: WO2016/030286
PCT Pub. Date: Mar. 3, 2016

(65) Prior Publication Data
US 2017/0252873 A1    Sep. 7, 2017

(30) Foreign Application Priority Data
Aug. 27, 2014 (EP) ..................... 14182395

(51) Int. Cl.
*B23K 35/26* (2006.01)
*C22C 9/02* (2006.01)
*B23K 35/30* (2006.01)
*B23K 35/362* (2006.01)
*B23K 35/02* (2006.01)
*B23K 1/00* (2006.01)
*C22C 9/04* (2006.01)
*C22C 13/00* (2006.01)
*H01L 23/00* (2006.01)
*H05K 1/18* (2006.01)
*H05K 3/34* (2006.01)

(52) U.S. Cl.
CPC .......... *B23K 35/262* (2013.01); *B23K 1/0016* (2013.01); *B23K 35/025* (2013.01); *B23K 35/0244* (2013.01); *B23K 35/302* (2013.01); *B23K 35/362* (2013.01); *C22C 9/02* (2013.01); *C22C 9/04* (2013.01); *C22C 13/00* (2013.01); *H01L 24/27* (2013.01); *H01L 24/83* (2013.01); *H05K 1/181* (2013.01); *H05K 3/3484* (2013.01); *H01L 2224/2732* (2013.01); *H01L 2224/27318* (2013.01); *H01L 2224/29111* (2013.01); *H01L 2224/29118* (2013.01); *H01L 2224/29139* (2013.01); *H01L 2224/29147* (2013.01); *H01L 2224/32245* (2013.01); *H01L 2224/83801* (2013.01); *H01L 2924/014* (2013.01); *H01L 2924/01015* (2013.01); *H01L 2924/1203* (2013.01); *H01L 2924/1304* (2013.01); *H01L 2924/20106* (2013.01); *H01L 2924/20107* (2013.01); *H05K 2201/10015* (2013.01); *H05K 2201/10022* (2013.01); *H05K 2201/10166* (2013.01); *H05K 2201/10174* (2013.01)

(58) Field of Classification Search
None
See application file for complete search history.

(56) References Cited

U.S. PATENT DOCUMENTS

| | | | | |
|---|---|---|---|---|
| 5,198,154 A | * | 3/1993 | Yokoyama | B22F 1/025 252/512 |
| 2006/0113683 A1 | * | 6/2006 | Dean | C22C 11/00 257/783 |
| 2007/0172381 A1 | * | 7/2007 | Deram | B23K 35/262 420/561 |
| 2009/0057378 A1 | | 3/2009 | Hwang et al. | |
| 2012/0119392 A1 | * | 5/2012 | Breer | B23K 1/0016 257/782 |
| 2013/0042912 A1 | * | 2/2013 | Kurihara | B23K 35/262 136/256 |
| 2013/0045131 A1 | * | 2/2013 | Li | B23K 35/282 420/516 |
| 2013/0140069 A1 | * | 6/2013 | Kitajima | H01B 1/22 174/257 |

FOREIGN PATENT DOCUMENTS

| | | |
|---|---|---|
| CN | 1615201 A | 5/2005 |
| CN | 1943030 A | 4/2007 |

(Continued)

OTHER PUBLICATIONS

Int'l Search Report and Written Opinion dated Oct. 2, 2015 in Int'l Application No. PCT/EP2015/069217.

(Continued)

*Primary Examiner* — Devang R Patel
(74) *Attorney, Agent, or Firm* — Panitch Schwarze Belisario & Nadel LLP

(57) ABSTRACT

A solder paste that contains or consists of (i) 10-30% by weight of at least one type of particles that each contain a phosphorus fraction of >0 to ≤500 wt-ppm and are selected from copper particles, copper-rich copper/zinc alloy particles, and copper-rich copper/tin alloy particles, (ii) 60-80% by weight of at least one type of particles selected from tin particles, tin-rich tin/copper alloy particles, tin-rich tin/silver alloy particles, and tin-rich tin/copper/silver alloy particles, and (iii) 3-30% by weight solder flux, in which the mean particle diameter of metallic particles (i) and (ii) is ≤15 μm.

12 Claims, No Drawings

(56) References Cited

FOREIGN PATENT DOCUMENTS

| CN | 1977368 A | 6/2007 |
|---|---|---|
| CN | 101356293 A | 1/2009 |
| CN | 102470472 A | 5/2012 |
| CN | 103659053 A | 3/2014 |
| DE | 19747041 A1 | 4/1999 |
| EP | 1464431 A1 | 10/2004 |
| WO | 2005027198 A2 | 3/2005 |
| WO | 2007081775 A2 | 7/2007 |
| WO | 2011009597 A1 | 1/2011 |

OTHER PUBLICATIONS

Office Action and Search Report dated May 25, 2018 CN Application No. 201580044880.0 (English Translation Only).
Office Action and Search Report dated Nov. 26, 2018 in CN Application No. 201580044880.5.

\* cited by examiner

SOLDER PASTE

CROSS-REFERENCE TO RELATED APPLICATIONS

This application is a Section 371 of International Application No. PCT/EP2015/069217, filed Aug. 21, 2015, which was published in the German language on Mar. 3, 2016 under International Publication No. WO 2016/030286 A1 and the disclosure of which is incorporated herein by reference.

BACKGROUND OF THE INVENTION

The present invention relates to a method for making a firmly-bonded connection of an electronic component to a substrate, a solder paste used in this method, and an arrangement that can be obtained in this method.

WO 2011/009597 A1 discloses a method for the firmly-bonded connection of an electronic component to a substrate, comprising a) providing an electronic component having a first surface to be connected and a substrate having a second surface to be connected, b) applying a solder paste to at least one of the surfaces to be connected, c) arranging the electronic component and the substrate appropriately such that the first surface of the electronic component to be connected and the second surface of the substrate to be connected contact each other by the solder paste, and d) soldering the arrangement from c) in order to generate a firmly-bonded connection between the electronic component and the substrate. The thickness of the applied layer of solder paste is at least 20 μm. The solder paste used in the method contains (i) 10-30% by weight (percent by weight) copper particles, (ii) 60-80% by weight particles made of at least one substance selected from the group consisting of tin and tin-copper alloys, and (iii) 3-30% by weight solder flux, wherein the mean particle diameter of the copper particles and of the particles made of at least one substance selected from the group consisting of tin and tin-copper alloys is ≤15 μm.

The applicant has noted that the method known from WO 2011/009597 A1 can be used, surprisingly, to obtain further improved soldered connections, in particular more reliable soldered connections under high temperature conditions in the range of, for example, 250 to 300° C., by using as copper particles in the solder paste particles made of copper and/or of copper-rich copper/tin and/or copper/zinc alloys, which each have a phosphorus content >0 to ≤500 wt-ppm.

BRIEF SUMMARY OF THE INVENTION

The invention therefore relates to a method for making a firmly-bonded connection of an electronic component to a substrate, comprising a) providing an electronic component having a first surface to be connected and a substrate having a second surface to be connected;

b) applying a solder paste onto at least one of the surfaces to be connected;

c) arranging the electronic component and the substrate such that the first surface of the electronic component to be connected and the second of the surface to be connected contact each other by the solder paste; and d) soldering the arrangement from c) to generate a firmly-bonded connection between the electronic component and the substrate;

wherein the solder paste contains (i) 10-30% by weight of at least one type of particles that each comprise a phosphorus fraction of >0 to ≤500 wt-ppm and are selected from the group consisting of copper particles, copper-rich copper/zinc alloy particles, and copper-rich copper/tin alloy particles, (ii) 60-80% by weight of at least one type of particles selected from the group consisting of tin particles, tin-rich tin/copper alloy particles, tin-rich tin/silver alloy particles, and tin-rich tin/copper/silver alloy particles, and (iii) 3-30% by weight solder flux, wherein the mean particle diameter of metallic particles (i) and (ii) is ≤15 μm and the thickness of the applied layer of solder paste is at least 20 μm.

The invention also relates to a solder paste that contains (i) 10-30% by weight of at least one type of particles that each comprise a phosphorus fraction of >0 to ≤500 wt-ppm and are selected from the group consisting of copper particles, copper-rich copper/zinc alloy particles, and copper-rich copper/tin alloy particles, (ii) 60-80% by weight of at least one type of particles selected from the group consisting of tin particles, tin-rich tin/copper alloy particles, tin-rich tin/silver alloy particles, and tin-rich tin/copper/silver alloy particles, and (iii) 3-30% by weight solder flux, wherein the mean particle diameter of metallic particles (i) and (ii) is ≤15 μm.

DETAILED DESCRIPTION OF THE INVENTION

In the scope of the invention, the term "electronic component" shall be understood to mean a component of an electrical and/or electronic circuit. The electronic component can be, for example, a chip, preferably a bare chip (semi-conductor chip) without housing, a semi-conductor diode, a transistor, a resistor or a capacitor.

In the scope of the invention, the term "substrate" shall be understood to mean a body to which the electronic component is connected. The substrate can be, for example, a printed circuit board, direct-bonded copper (DBC or DCB) or a lead frame.

The term "printed circuit board" is used herein as a synonym of printed circuit card, board or printed circuit and describes a carrier for electronic components. Printed circuit boards consist of electrically insulating material to which conductive connections adhere (printed conductors). Fiber-reinforced plastic material, for example, can be used as electrically insulating material.

Direct-bonded copper is a term used to refer to a ceramic plate (for example made of aluminum oxide, aluminum nitride or beryllium oxide), wherein one surface or the two surfaces with the largest surface area that are parallel to each other are bonded with copper through an oxidation process at high temperatures. At the selected conditions, a eutectic mixture of copper and oxygen is formed that becomes connected to both the copper and the substrate oxide.

A lead frame shall be understood to be an IC (integrated circuit, microchip) housing that essentially consists of a chip carrier and connecting leads only. The term "lead frame" is used herein as a synonym of the terms connecting frame and chip carrier. The chip carrier comprises a substrate that constitutes its base frame and is fabricated from metal, for example from copper, copper alloys, a combination of copper and a finisher (e.g., nickel, silver or gold), iron-nickel alloys or other invar alloys.

The electronic component comprises at least one first surface that is intended to be used for connecting the electronic component to a surface of the substrate by the contact layer that is generated through the solder paste. This surface can just as well be part of a larger surface.

The substrate comprises at least a second surface that is intended to be used for connecting the substrate to the surface of the electronic component described above by the contact layer generated through by the solder paste. This surface can also just as well be part of a larger surface.

According to the invention, the surface of the electronic component that is connected to the substrate by the contact layer generated through the solder paste is called "first surface to be connected" and the surface of the substrate that is connected to the electronic component by the contact layer generated through the solder paste is called "second surface to be connected."

Customarily, a metallization layer has been applied at least to the first surface of the electronic component to be connected. It is also customary for a metallization layer to have been applied at least to the second surface of the substrate to be connected. Customarily, both electronic component and substrate possess a metallization layer at least on the surfaces to be connected. It is therefore customary that the electronic component comprises a metallization layer on a surface that is situated opposite from a metallization layer on the surface of the substrate and that these metallization layers are connected to each other through the contact layer. In the scope of the invention, the metallization layers of the electronic component that are usually present are part of the electronic component and the metallization layers of the substrate that are usually present are part of the substrate.

The metallization layer, if present, preferably accounts for a fraction of the surface area of at least 50%, more preferably at least 70%, even more preferably at least 90%, and particularly preferably at least 95%, such as, for example, 100%, of at least one of the surfaces of the electronic component. On the substrate, the metallization layer preferably accounts for a fraction of the surface area of at least 50%, more preferably at least 70%, even more preferably at least 90%, and particularly preferably at least 95%, such as, for example, 100%, of the surface that is connected to the electronic component through the contact layer.

Preferably, the metallization layer is a solderable layer. The metallization layer preferably contains at least one element selected from the group consisting of copper, silver, gold, tin, and palladium. The metallization layer can consist entirely of these elements, solderable compounds of these elements, or mixtures or alloys of these elements.

The solder paste according to the invention is being applied onto at least one of the surfaces of the electronic component or substrate that are to be connected.

Relative to its weight, the solder paste according to the invention contains (i) 10-30% by weight, preferably 12-28% by weight, and more preferably 15-25% by weight of at least one type of particles that comprise a phosphorus fraction of >0 to ≤500 wt-ppm, preferably >0 to ≤100 wt-ppm, more preferably >0 to ≤50 wt-ppm, and, in particular, >0 to ≤10 wt-ppm, and are selected from the group consisting of copper particles, copper-rich copper/zinc alloy particles, and copper-rich copper/tin alloy particles, (ii) 60-80% by weight, preferably 62-78% by weight, and more preferably 65-75% by weight of at least one type of particles selected from the group consisting of tin particles, tin-rich tin/copper alloy particles, tin-rich tin/silver alloy particles, and tin-rich tin/copper/silver alloy particles, and (iii) 3-30% by weight, preferably 5-20% by weight, and more preferably 6-15% by weight, solder flux, wherein the mean particle diameter of metallic particles (i) and (ii) is ≤15 µm.

Preferably, the solder paste according to the invention contains, relative to its weight, (i) 10-30% by weight, preferably 12-28% by weight, and more preferably 15-25% by weight of at least one type of particles that comprise a phosphorus fraction of >0 to ≤500 wt-ppm, preferably >0 to ≤100 wt-ppm, more preferably >0 to ≤50 wt-ppm, and, in particular, >0 to ≤10 wt-ppm and are selected from the group consisting of copper particles, copper-rich copper/zinc alloy particles, and copper-rich copper/tin alloy particles, (ii) 60-80% by weight, preferably 62-78% by weight, and more preferably 65-75% by weight of at least one type of particles selected from the group consisting of tin particles, tin-rich tin/copper alloy particles, tin-rich tin/silver alloy particles, and tin-rich tin/copper/silver alloy particles, and (iii) 3-30% by weight, preferably 5-20% by weight, and more preferably 6-15% by weight, solder flux, wherein the mean particle diameter of metallic particles (i) and (ii) is ≤15 µm.

The purity of the copper of the copper particles contained in the solder paste is preferably at least 99.9% (3 N) and more preferably at least 99.99% (4 N). In the case of the particles made of copper-rich copper/zinc alloys and/or copper-rich copper/tin alloys, the composition is 60 to 99.5% by weight copper and, correspondingly, 0.5 to 40% by weight zinc and/or tin. In each case, the phosphorus fraction of all particles is >0 to ≤500 wt-ppm, preferably >0 to ≤100 wt-ppm, more preferably >0 to ≤50 wt-ppm, and, in particular, >0 to ≤10 wt-ppm. Preferably, the particles are particles produced by atomization in an inert gas atmosphere or, in other words, particles produced by atomization of liquid (molten) copper and/or melt of any of the specified copper alloys into an inert gas atmosphere.

As mentioned above, the solder paste contains at least one type of particles selected from the group consisting of tin particles, tin-rich tin/copper alloy particles, tin-rich tin/silver alloy particles, and tin-rich tin/copper/silver alloy particles. These tin particles and/or tin-rich metal particles are the so-called solder.

If the solder paste contains soldering metal particles made of tin-rich tin/copper, tin/silver and/or tin/copper/silver alloys, the tin fraction thereof is preferably in the range of 95-99.5% by weight and the copper and/or silver fraction, accordingly, is in the range of 0.5-5% by weight.

The mean particle diameters of metallic particles (i) and (ii) are ≤15 µm, preferably ≤13 µm, more preferably ≤11 µm, and even more preferably <8 µm. Preferably, the mean particle diameter is in the range of 2-15 µm, more preferably in the range of 2-13 µm, even more preferably in the range of 2-11 µm, and yet even more preferably in the range of 2-8 µm.

The term "mean particle diameter" used herein means the mean particle size (d50) that can be determined with an optical microscope. Measurements of this type can be made with an optical microscope, for example at 200-fold magnification, in combination with a common digital image processing system (CCD digital camera and analytical software), for example with a measuring system from Microvision Instruments. For example, a mean particle diameter of ≤15 µm can mean that at least 90 percent of the particles have a particle diameter ≤15 µm and less than 10 percent of the particles have a particle diameter of more than 15 µm. Accordingly, a mean particle diameter in the range of 2-15 µm means that at least 90 percent of the particles have a particle diameter in the range of 2-15 µm and less than 10 percent of the particles have a particle diameter of less than 2 µm or more than 15 µm.

It can be preferred according to the invention that less than 1 percent of particles (i) and (ii) exceed a certain particle diameter. The particle diameter that may be exceeded by less than 1 percent of particles (i) and (ii) is preferably 15 μm, more preferably 11 μm, and even more preferably 8 μm.

Particles (i) and (ii) can have different geometries. However, particles (i) and (ii) are preferably spherical in shape. However, it is obvious to a person skilled in the art that a minor fraction of particles (i) and (ii) employed presently can be non-spherical in shape for production reasons. However, it is preferred that at least 90% by weight, more preferably at least 95% by weight, even more preferably at least 99% by weight or 100% by weight of particles (i) and (ii) are present in spherical shape. It is also preferred that the solder paste contains less than 5% by weight, more preferably less than 1% by weight, even more preferably less than 0.1% by weight, for example 0% by weight, of particles (i) and (ii) in the shape of flakes.

It is an object of the solder flux present in the solder paste to reduce the surface of the substrate and/or electronic component during the soldering process (i.e., to de-oxidize), prevent renewed oxide formation before and after the soldering process, and reduce the inclusion of foreign substances. Moreover, addition of the solder flux should reduce the surface tension of the liquid solder. For example, colophony, colophony-based resin systems, water-based resin systems or systems based on carboxylic acids (e.g., carboxylic acids such as citric acid, adipic acid, cinnamic acid, and benzylic acid), amines (e.g., tertiary amines), and solvents (e.g., polar solids containing water and a polyol such as glycol or glycerol) can be used as solder flux.

Moreover, the solder paste according to the invention can contain further ingredients such as, for example, alcohols, fatty acids (e.g., saturated fatty acids, such as oleic acid, myristic acid, palmitic acid, margaric acid, stearic acid or eicosanoic acid), polysiloxane compounds or phosphide compounds.

The solder paste according to the invention contains no lead and is thus lead-free. In the scope of the invention, being lead-free shall be understood to mean that the solder paste contains no lead except for contaminating lead that may possibly be present for technical reasons. Accordingly, lead-free shall be understood to mean a lead content of less than 1, preferably of less than 0.5, more preferably of less than 0.1, even more preferably of less than 0.01% by weight and in particular of 0% by weight, based on the weight of the solder paste.

According to the invention, electronic component and substrate are connected to each other in a firmly-bonded manner through soldering. Accordingly, firmly-bonded connections are connections in which the connected partners are kept together through atomic or molecular forces.

They are preferably non-separable connections that can be separated only by destroying the connecting means.

According to the invention, an arrangement is first formed that consists of the substrate, the electronic component, and a layer of the solder paste according to the invention that is situated between the substrate and electronic component. Accordingly, the substrate and electronic component are arranged such that the first surface of the substrate to be connected and the second surface of the electronic component to be connected contact each other through the solder paste. Usually, the solder paste preferably contacts the metallization layer of the substrate, which is usually present, and the metallization layer of the electronic component, which is usually present.

Preferably, for this purpose, a layer of the solder paste according to the invention is first applied to the surface of the substrate to be connected, preferably to the surface of the substrate containing a metallization layer. The application can be effected through any of the methods known according to the prior art, for example screen printing methods, stencil printing method, jet or dispensing technique. There is no need for the solder paste to cover the entire surface of the substrate. Rather, the solder paste can just as well be applied just to parts of the surface of the substrate, for example to selected soldering surfaces. Subsequently, a surface of the electronic component, preferably the surface comprising the metallization layer, is placed on the solder paste thus applied.

The thickness of the applied layer of solder paste is at least 20 μm, more preferably at least 25 μm, and even more preferably at least 50 μm. According to a preferred embodiment, the thickness of the applied layer is in the range from 20-150 μm, more preferably in the range from 30-120 μm, and particularly preferably in the range from 50-100 μm. In the scope of the invention, the term "thickness of the applied layer" shall be understood to mean the distance between the surfaces of substrate and electronic component to be connected, preferably between the metallization layers of the surfaces of substrate and electronic component that are to be connected, right before soldering. Accordingly, the thickness of the applied layer is determined essentially by the quantity of solder paste employed.

During the subsequent solder process, the distance between electronic component and substrate is reduced significantly, possibly by approximately 50 percent, depending on the exact composition of the solder paste.

The arrangement made up of electronic component, substrate, and solder paste situated between these is finally soldered, which is associated with the formation of an arrangement made up of electronic component, substrate, and intervening contact layer. According to general definition, soldering shall be understood to mean a thermal method for firmly-bonded joining of materials without reaching the solidus temperature of the materials.

For soldering, the arrangement described above is heated, preferably evenly, until the actual soldering temperature is reached. According to a preferred embodiment, the heating proceeds at a rate of ≤3° C. per second.

Preferably, the soldering temperature is approx. 10-50° C., more preferably approx. 15-45° C., and even more preferably 25-35° C., for example approx. 30° C., above the melting temperature of the solder employed. According to another preferred embodiment, the soldering temperature is below 280° C., for example in the range of 240-260° C.

For soldering, the temperature is kept above the liquidus temperature of the solder contained in the solder paste according to the invention, for example, for a period of at least 15 seconds, preferably of at least 20 seconds, and even more preferably of at least 30 seconds.

Presumably, the cooling of the soldered arrangement to below the liquidus temperature of the solder present in the solder paste is associated with diffusion of the copper originating from the particles of type (i) into a eutectic tin-copper phase that has been generated during the soldering process.

It can be advantageous to subject the arrangement made up by electronic component, substrate, and intervening contact layer that is obtained during the soldering process to a heat treatment following the soldering process. Heat treatment shall be understood to mean treating the arrangement with heat below the liquidus temperature of the solder.

The heat treatment preferably proceeds at a temperature above 40° C., for example in the range of 40-217° C., more preferably in the range of 100-210° C., and even more preferably in the range of 150-205° C. The heat treatment preferably proceeds for a duration of 1 minute to 24 hours, more preferably for 10 minutes to 10 hours, and even more preferably for 20 minutes to 1 hour. The duration of heat treatment is usually correlated with the temperature and the longer the duration, the lower the temperature used for heat treatment.

The method according to the invention necessitates no expensive modifications to be made to the customary methods for the production of arrangements made up by electronic component, substrate, and intervening contact layer. In particular, the method according to the invention is not associated with particular requirements regarding the machinery used for conventional soldering processes. The method according to the invention can therefore be carried out, for example, at conventional conditions and using existing machinery, if any.

According to a preferred embodiment, the arrangement according to the invention can be or is produced by the method described above.

In the arrangement according to the invention, the distance between electronic component and substrate preferably is 8-50 µm, more preferably 10-30 µm, and even more preferably 12-28 µm. This distance shall be understood to be the distance between the surfaces of electronic component and substrate that are to be connected, whereby the metallization layers, which are usually present, are part of the electronic component and/or substrate. The specified distance thus corresponds to the thickness of the contact layer between electronic component and substrate after soldering.

According to the invention, the soldering conditions, in particular the thickness of the applied layer of solder paste, temperature and time, and, if applicable, the heat treatment conditions, in particular temperature and time, can be adjusted in the soldering process described above such that the contact layer described above is attained. The formation of the contact layer having the desired properties can be traced easily through analysis of corresponding microsections.

EXAMPLES

Inventive Example 1

A soldering piece was produced which contained 69 percent by weight particles of a tin-copper alloy (SnCu0.7) with a mean particle diameter of 8 µm, 20 percent by weight copper particles with a mean particle diameter of 8 µm and a phosphorus fraction of 5 wt-ppm, and 11 percent by weight of a solder flux system based on colophony.

The solder paste was applied through a metal template onto a copper sheet. The thickness of the applied layer of solder paste was 75 µm. Subsequently, the surface of the copper sheet provided with solder paste was configured, by machine, with a bare chip sized 2 mm×2 mm that comprised a metallization layer made of nickel/silver. For this purpose, the bare chip was placed appropriately on the solder paste such that the metallization layer of the bare chip contacted the surface of the copper sheet via the solder paste.

The arrangement made up of copper sheet, bare chip, and intervening solder paste was then placed in a soldering furnace, heated at a rate of 2.5 Kelvin per second to a temperature of 260° C., and this temperature was maintained for 30 seconds for soldering.

Inventive Example 2

The procedure was the same as in Example 1 with the sole exception being that the phosphorus fraction of the copper particles was 500 wt-ppm.

Reference Example 3

The procedure was the same as in Example 1 with the sole exception being that the phosphorus fraction of the copper particles was 1,100 wt-ppm.

Reference Example 4

The procedure was the same as in Example 1 with the sole exception being that the phosphorus fraction of the copper particles was 3,000 wt-ppm.

Reference Example 5

The procedure was the same as in Example 1 with the exception that the solder paste contained 87 percent by weight of the particles of the tin-copper alloy (SnCu0.7) with a mean particle diameter of 8 µm, no copper particles, and 13 percent by weight of the solder flux system based on colophony.

In various tests of the stability of the soldered connections and/or soldered arrangements produced according to Examples 1 to 5, it was evident that the soldered connections of the arrangements produced in accordance with Inventive examples 1 and 2 showed significantly higher shear strength at 200° C. than the arrangements produced in accordance with Reference examples 3 and 4 or in accordance with Reference example 5.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A solder paste comprising (i) 10-30% by weight of at least one type of particles each comprising a phosphorus fraction of >0 to ≤500 wt-ppm and selected from the group consisting of copper particles, copper-rich copper/zinc alloy particles, and copper-rich copper/tin alloy particles, (ii) 60-80% by weight of at least one type of particles containing no phosphorus and selected from the group consisting of tin particles, tin-rich tin/copper alloy particles, tin-rich tin/silver alloy particles, and tin-rich tin/copper/silver alloy particles, and (iii) 3-30% by weight solder flux, wherein the mean particle diameter of metallic particles (i) and (ii) is ≤15 µm.

2. The solder paste according to claim 1, wherein the phosphorus content is >0 to ≤100 wt-ppm.

3. The solder paste according to claim 1, wherein the composition of the copper-rich copper/zinc alloys or copper-rich copper/tin alloys is 60 to 99.5% by weight copper and 0.5 to 40% by weight zinc or tin.

4. The solder paste according to claim 1, wherein the particles of type (i) are produced by atomization in an inert gas atmosphere.

5. The solder paste according to claim 1, wherein the composition of the tin-rich tin/copper alloys, tin/silver alloys or tin/copper/silver alloys is 95-99.5% by weight tin and 0.5-5% by weight copper, silver or copper plus silver.

6. A method for making a firmly-bonded connection of an electronic component to a substrate, comprising
   a) providing an electronic component having a first surface to be connected and a substrate having a second surface to be connected;
   b) applying a solder paste according to claim 1 onto at least one of the first and second surfaces to be connected;
   c) arranging the electronic component and the substrate such that the first surface of the electronic component to be connected and the second surface of the substrate to be connected contact each other by the solder paste; and
   d) soldering the arrangement from c) to generate a firmly-bonded connection between the electronic component and the substrate;
wherein the thickness of the applied layer of solder paste is at least 20 μm.

7. The method according to claim 6, wherein the electronic component is a chip, a semiconductor diode, a transistor, a resistor or a capacitor.

8. The method according to claim 6, wherein the substrate is a printed circuit board, a direct-bonded copper or a lead frame.

9. The method according to claim 6, wherein the solder paste is applied by a screen printing method, a stencil printing method, jet or a dispensing technique.

10. The method according to claim 6, wherein the soldering temperature is in a range of 240-260° C.

11. The method according to claim 6, wherein the arrangement obtained after completion of step d) is heat-treated at a temperature in a range of 40-217° C. for a period of 1 minute up to 24 hours.

12. An arrangement obtained by the method of claim 6.

* * * * *